US011177410B2

(12) United States Patent
Gäbler et al.

(10) Patent No.: US 11,177,410 B2
(45) Date of Patent: Nov. 16, 2021

(54) ELECTRICALLY MODULATED IR SENSITIVE PHOTODIODE AND ITS INTEGRATION IN CMOS

(71) Applicant: X-FAB SEMICONDUCTOR FOUNDRIES GmbH, Erfurt (DE)

(72) Inventors: Daniel Gäbler, Apolda (DE); Sebastian Wicht, Riechheim (DE)

(73) Assignee: X-FAB SEMICONDUCTOR FOUNDRIES GMBH, Erfurt (DE)

( * ) Notice: Subject to any disclaimer, the term of this patent is extended or adjusted under 35 U.S.C. 154(b) by 0 days.

(21) Appl. No.: 16/351,963

(22) Filed: Mar. 13, 2019

(65) Prior Publication Data
US 2019/0288151 A1    Sep. 19, 2019

(30) Foreign Application Priority Data
Mar. 13, 2018  (DE) .......................... 102018105752.0

(51) Int. Cl.
*H01L 27/146* (2006.01)
*H01L 31/11* (2006.01)
(Continued)

(52) U.S. Cl.
CPC ........ *H01L 31/11* (2013.01); *H01L 31/02019* (2013.01); *H03C 1/34* (2013.01)

(58) Field of Classification Search
CPC ............... H01L 31/11; H01L 31/02019; H01L 31/022408; H01L 31/103; H01L 31/03529; H01L 31/1804; H01L 27/32–326; H01L 51/50–5012; H01L 51/525–5287; H01L 2227/32–326; H01L 2251/5323–5361;
(Continued)

(56) References Cited

U.S. PATENT DOCUMENTS 5,736,733 A * 4/1998 Shima .................. H04N 5/3742
                                                          250/208.2
6,803,557 B1   10/2004 Taylor et al.
(Continued)

FOREIGN PATENT DOCUMENTS

DE        102016123037        6/2017

OTHER PUBLICATIONS

Office Action dated Aug. 28, 2018 in corresponding German Application No. 102018105752.0, 2 pages.

*Primary Examiner* — Samuel Park
(74) *Attorney, Agent, or Firm* — Nixon & Vanderhye P.C.

(57) ABSTRACT

Electrically modulatable photodiode, comprising a substrate having a first and a second p-n junction, a common contact for jointly contacting the p or n dopings of the two p-n junctions, and two further contacts for separately contacting the other doping of the p and n dopings of the two p-n junctions, and a circuit, wherein the circuit is designed to measure a current flow caused by charge carriers which have been generated by impinging radiomagnetic waves in the substrate and which have reached the first further contact, and to switch the second further contact at different times to at least one first and one second switching state, wherein in the first switching state the second further contact is switched to the floating state and in the second switching state a potential is applied, and wherein a blocking voltage applied between the common contact and the first further contact is constant.

17 Claims, 8 Drawing Sheets

(51) Int. Cl.
*H01L 31/02* (2006.01)
*H03C 1/34* (2006.01)

(58) Field of Classification Search
CPC .... H01L 2924/12044; H03C 1/34; G01J 1/44; G01J 2001/446; G02F 1/13; G06F 3/04; G06F 2203/04103
See application file for complete search history.

(56) References Cited

U.S. PATENT DOCUMENTS

| | | |
|---|---|---|
| 8,946,617 B2 | 2/2015 | Holz et al. |
| 9,214,492 B2 | 12/2015 | Van Der Tempel et al. |
| 2007/0063299 A1* | 3/2007 | Hwang ............. H01L 27/14603 257/432 |
| 2009/0127437 A1* | 5/2009 | Li ..................... H01L 27/14643 250/208.1 |
| 2009/0303366 A1* | 12/2009 | Gambino .......... H01L 27/14623 348/308 |
| 2010/0155867 A1* | 6/2010 | Arai .................... H01L 27/1443 257/432 |
| 2015/0233759 A1* | 8/2015 | Rubaldo ................ G01J 1/44 250/206 |
| 2017/0154906 A1 | 6/2017 | Gaebler |
| 2017/0194367 A1 | 7/2017 | Fotopoulou et al. |

\* cited by examiner

ELECTRICALLY MODULATED IR SENSITIVE PHOTODIODE AND ITS INTEGRATION IN CMOS

This application claims priority to DE Patent Application No. 102018105752.0 filed 13 Mar. 2018, the entire contents of which is hereby incorporated by reference.

The invention relates to a photodiode and specifically to an electrically modulated photodiode.

The spectral sensitivity of detectors can be influenced by spectral filters in the beam path. Use can be made of absorption filters or reflection filters, or combinations thereof. These filters are mounted outside of the detector and are therefore not integrally formed in the semiconductor arrangement that forms the detector. For this reason, the sensitivity of the detector can only be modulated by moving the filters in front of the detector.

Also known is the principle of the current-assisted photonic demodulator ("CAPD"). CAPD makes it possible to change the spectral sensitivity of a photodiode by influencing an electric current. However, this means that the component does not function without a permanent current flow. The power consumption therefore associated with CAPD detectors is a significant disadvantage, particularly when the aim is to operate a large number of detector elements within a small space (integrated on a silicon chip).

The invention will now be explained on the basis of various exemplary embodiments of the invention and with the aid of the drawings, in which FIG. 1 shows a first embodiment of the invention, in which a second cathode is switched to the floating state;

Figure 1:
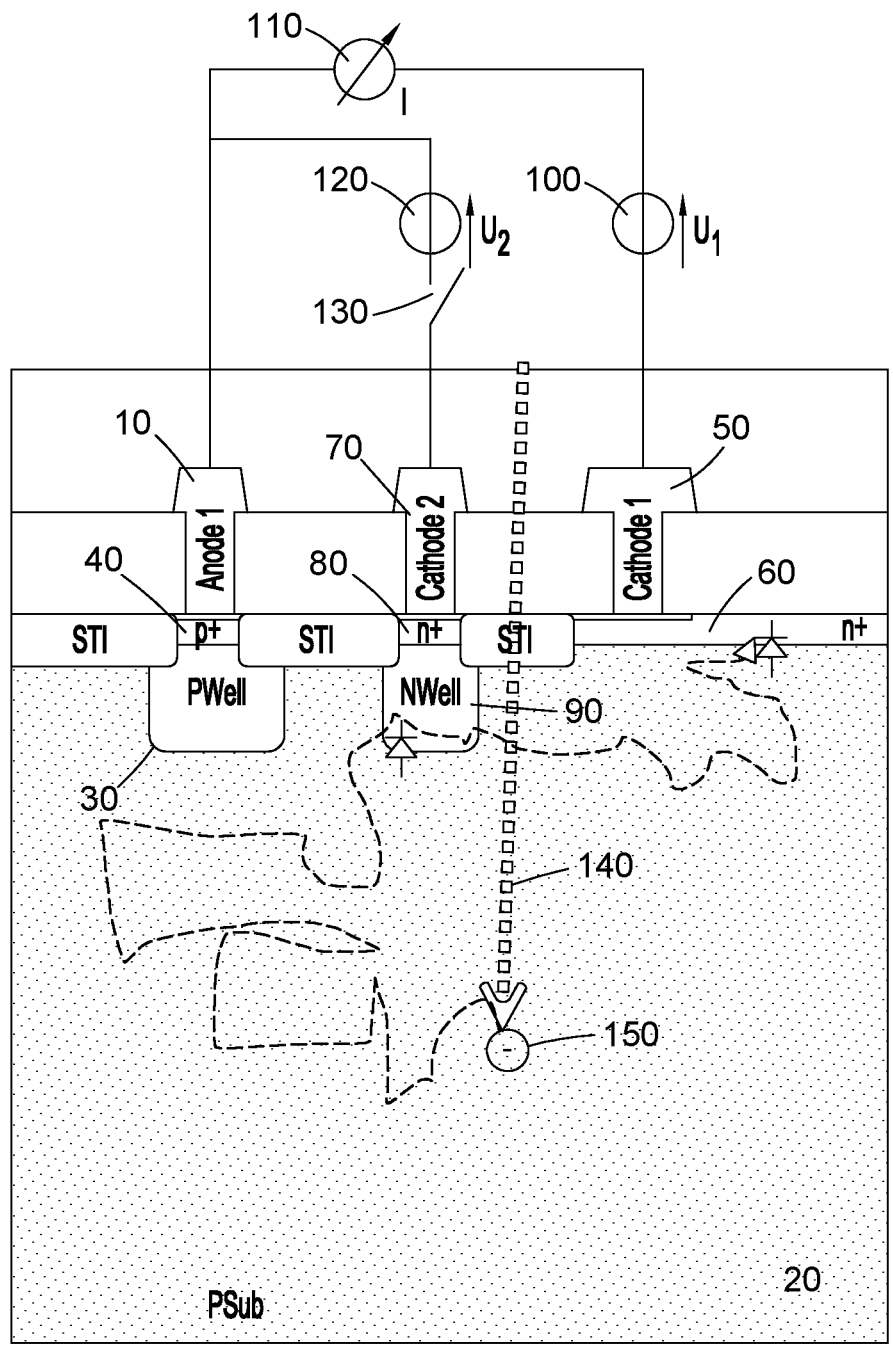

In one exemplary embodiment, an electrically modulatable photodiode is provided. The photodiode comprises a substrate having a first and a second p-n junction, a common contact for jointly contacting the p or n dopings of the two p-n junctions, and two further contacts for separately contacting the other doping of the p and n dopings of the two p-n junctions. The photodiode further comprises a circuit which is designed to measure a current flow caused by charge carriers which have been generated by impinging radiomagnetic waves in the substrate and which have reached the first further contact, and to switch the second further contact to at least one first and one second switching state. In the first switching state, the second further contact is switched to the floating state. In the second switching state, a potential is applied. In one embodiment, a blocking voltage applied between the common contact and the first further contact is preferably constant. The p-n junction associated with the first further contact functions as a spectral detector. The p-n junction associated with the second further contact is responsible for the spectral modulation. By applying a voltage to the second p-n junction, the latter becomes active and collects a significant proportion of the light-induced charge carriers. If, on the other hand, no voltage is applied to the second p-n junction, the charge carriers are collected exclusively in the first p-n junction.

If the substrate is negatively doped in the contacted region, the first and second further contacts are cathodes. In this case, the common contact is the anode associated with the p-n junctions.

The modulation contrast results from the diffusing charge carriers which arrive at the first p-n junction. Charge carriers which are generated in the drift region of the first p-n junction, that is to say charge carriers which can move towards the first further contact under the effect of the electric field of the p-n junction of the first further contact, are not influenced by the second p-n junction.

In one embodiment, both p-n junctions are operated in the blocking direction. Current losses are therefore minimal. Since only the switching state of the part of the circuit associated with the second further contact is changed, the measuring circuit associated with the first further contact can be designed in a simple manner. This makes it possible to modulate the spectral sensitivity of the photodiode using a simplified overall circuit of the photodiode.

In one embodiment, the minority charge carrier collection volume of the photodetector for the target wavelength corresponds approximately to that of the first p-n junction.

In one embodiment, the second switching state comprises a plurality of switching states. The circuit is designed to apply a different potential to the second further contact in each of the plurality of switching states.

In one embodiment, the first and second further contact each have a p-n junction. The p-n junction of the second further contact extends deeper into the substrate than the p-n junction of the first further contact. The wavelength-dependent depth of penetration of light shows that a deeply penetrating spatial region of influence particularly collects charge carriers which are generated by light of relatively large wavelengths (red/IR). A first p-n junction that is as shallow as possible and a second p-n junction that is as deep as possible can therefore achieve an optimal modulation contrast.

In one embodiment, the p-n junction of the second further contact extends into the substrate to the maximum depth permitted by the production process used.

In one embodiment, the p-n junction of the second further contact contains a doped well. The latter partially or completely encloses the doping of the p-n junction of the first further contact.

In one embodiment, parts of the substrate that are not influenced by operating steps performed after formation of the substrate extend through the doped well of the second further contact to the p-n junction of the first further contact at one or more locations. The circuit is designed to apply in the second switching state a voltage which expands the spatial region of influence of the second further contact so that all the segments of the substrate which are in direct contact with the doping of the first further contact are covered by the spatial region of influence. In one embodiment, the doped well of the second further contact is structured such that a ratio between the cross-section of the original substrate material, which offers diffusion paths for charge carriers to the first further contact when the second further contact is floating and which is completely enclosed by the space charge region of the second further contact when a voltage is applied to the second further contact, and the cross-section of the doped well of the p-n junction of the second further contact is maximized. The cross-sections are measured here in a plane parallel to the substrate surface, so that the modulation of the sensitivity of the diode is maximized.

Modulation contrasts >10, preferably >>10, can be achieved, particularly when the second p-n junction achieves an effective "enveloping" of the first p-n junction. In embodiments in which the second p-n junction is configured such that, in the switched-off state, it leaves as many open paths as possible for the diffusing charge carriers, that is to say is configured in a "perforated" manner so as not to hinder the diffusion by the electric field resulting from its doping profile, but in the switched-on state effectively closes said "holes" as a result of the expansion of the space charge region, the absolute spectral sensitivity of the first p-n junction is also high (comparable to a "normal" single p-n junction without a second p-n junction for modulation purposes).

In one embodiment, the photodiode comprises only a single common contact.

In one embodiment, the substrate has a doping gradient which runs perpendicular to the surface. This generates a fixed electric field. The latter accelerates charge carriers generated in the substrate towards the substrate surface.

In one embodiment, the common contact is mounted on a substrate surface. A further common contact is mounted on a substrate surface opposite the common contact. The circuit is designed to apply to the further common contact a voltage which generates in the substrate a potential gradient between the common contacts and thus to impress an electric field which accelerates charge carriers in the direction of the first further contact.

In one embodiment, the substrate and the dopings of the two further contacts are produced in the CMOS process.

In one embodiment, the doped well of the second further contact extends to the maximum substrate depth permitted by the CMOS process.

In one embodiment, the doping concentration of the substrate is 1e12 to 1e16, preferably 0.8-2e15 and preferably 1e15 [/cm$^3$].

In one embodiment, the doping concentration of the well associated with the second further contact is 1e16-1e18, preferably 7e17 [/cm$^3$].

As the frequency of switching between the switching states of the second further contact increases, the power loss of the photodiode increases and develops towards the determining loss factor. In one embodiment, the doping concentration of the substrate is such as to achieve a charge carrier life span in a vertical extension which corresponds at least to the lateral spacing between the two p-n junctions. By virtue of a low doping of the substrate material, the capacitance of the p-n junctions decreases, thereby reducing switchover losses. In addition, the charge carrier life span increases, as a result of which the initial volumes of the p-n junctions become larger. This is particularly advantageous for the longer-wave spectral range, since this requires a large absorption volume owing to the considerable depth of penetration of the light when high quantum yields are to be achieved.

In one embodiment, the invention extends to a substrate comprising two p-n junctions for the photodiodes described above.

In one embodiment, the invention extends to a method for detecting a red light and/or infrared component of light impinging on a photodiode described above. The method comprises measuring a current flowing in the first further contact, wherein the second further contact is switched to the floating state during the measurement. The method further comprises measuring a current flowing in the first further contact, wherein a potential is applied to the second further contact during this measurement. In one embodiment, the difference between the measurements is then determined.

In one embodiment, the invention extends to a method for producing one of the photodiodes described above. The method comprises the steps of producing a doped substrate and producing two p-n junctions which do not engage in one another. In one embodiment, the method is a CMOS method.

In the text below, embodiments of the invention will be described with reference to the drawings. In these embodiments, the common contact is formed by a positive doping and the two further contacts are formed by negative dopings, so that the common contact forms the anode associated with the two p-n junctions and the two further contacts form the first and second cathode associated with the two p-n junctions.

FIG. 1 shows a first embodiment of the invention, in which an anode 10 is connected to a positively doped semiconductor substrate 20 via a positively doped well 30 and a positively doped surface contact 40. A first cathode 50 is conductively connected to the semiconductor substrate 20 by a negatively doped region 60. The semiconductor substrate 20 and the region 60 form a first p-n junction, which in the figure is shown symbolically as a diode. The p-n junction is formed at the surface of the semiconductor substrate.

A second cathode 70 is conductively connected to the semiconductor substrate 20 by a negatively doped region 80 and the negatively doped well 90. The contact between the negatively doped well 90 and the semiconductor substrate 20 forms a second p-n junction, which once again is shown symbolically as a diode. The second p-n junction extends further into the semiconductor substrate than the first p-n junction, preferably to a maximum depth of penetration that can be achieved in the CMOS process.

A voltage $U_1$ is applied by a voltage source 100 between the anode 10 and the cathode 50. The current flow between the anode 10 and the cathode 50 is measured by an ammeter 110. A second voltage source 120 is provided between the anode 10 and the second cathode 70 and can be switched on by means of a switch 130, but in the configuration shown in FIG. 1 no connection to the cathode 2 is established. The switch 130 is shown schematically as a mechanical switch. In practical embodiments, however, the switch is a semiconductor component, for example a transistor.

The arrow shown in dashed line in FIG. 1 represents a photon 140 penetrating into the semiconductor substrate 20. In the semiconductor substrate 20, the photon generates a free charge carrier 150 which diffuses within the semiconductor substrate 20 and, if it should reach the first cathode 50 as shown in FIG. 1, is detected as current flow by the ammeter 110. Since no potential is being applied to the second cathode 70/80/90, the charge carrier 150 can diffuse past the second cathode 70/80/90 unhindered, including through the doped well 90.

As can be seen from FIG. 1, the charge carrier 150 can diffuse to the first cathode 50 regardless of the location in the semiconductor 20 at which it was generated. This means that charge carriers 150 can reach the cathode 50 regardless of the depth at which they were generated. Photons of different wavelengths have different material penetration depths. Only in the switching state shown in FIG. 1 is it impossible to distinguish between impinging light of different wavelengths.

Figure 2:
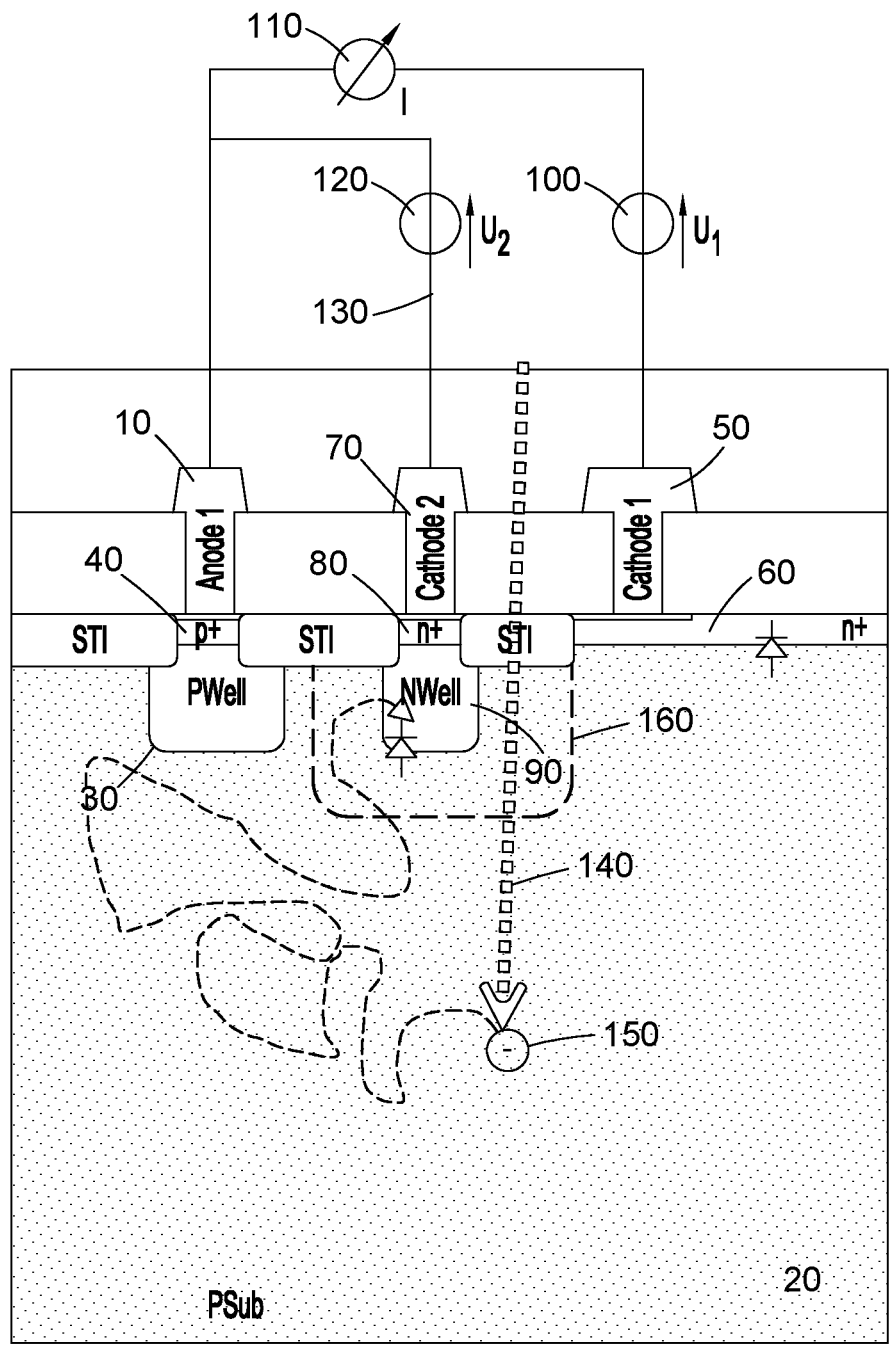
FIG. 2 shows the first embodiment of the invention, wherein a voltage is applied to the second cathode.

FIG. 2 shows the embodiment of FIG. 1 in a second switching state, in which the switch 130 is closed. In this switching state, therefore, a voltage $U_2$ is applied between the anode 10 and the second cathode 70. Since the p-n junction between the semiconductor substrate 20 and the well 90 is switched into the blocking mode, the current flow through the second cathode 70/80/90 is minimal. As can be seen from FIG. 2, the spatial region of influence 160 of this p-n junction becomes larger under the effect of the applied voltage. When the charge carrier 150 diffuses into this spatial region of influence 160 of the second cathode, the charge carrier then flows off via the second cathode 70 and the voltage source 120 and therefore cannot reach the first cathode 50. Since the first cathode 50 is used to measure the current generated by photons 140, charge carriers which flow off via the second cathode 70 are not taken into consideration when measuring the current. It is worth mentioning that, in one embodiment, the voltage U2 may be 0V. In this embodiment, the size of the space charge region 160 corresponds to the space charge region defined by the doping of the well 90 and of the substrate 20. In contrast to the conditions prevailing in FIG. 1, however, charge carriers 150 can no longer diffuse through this space charge region since the latter is now conductively connected to the voltage source 120 and therefore conducts the charge carriers out of the substrate 20.

By simply providing a second cathode 70 which is floating in one circuit arrangement and is operated in the blocking state in a second circuit arrangement, a current flow for each switching state can be measured at the first cathode 50. The current measured in the switching state shown in FIG. 2 is generated exclusively by photons which, despite the extended spatial region of influence of the second cathode 70, can diffuse to the first cathode 50. The current measured in the switching state shown in FIG. 1 is generated by all the impinging photons. The difference between the two currents makes it possible to deduce the charge carriers conducted away by the second cathode 70.

Since no changes have to be made between the two switching states in the circuit connected to the first cathode, the circuit can be of simple and compact design.

Although only two switching states are considered in the above discussion, namely the switching of the second cathode 70 between the floating state and the state in which a potential is applied, it is also possible, in addition to and/or as an alternative to the floating state of the second cathode 70, to apply various predefined different voltage values to the second cathode 70 so that the size of the space charge region 160 changes with the different application states. As the size of the space charge region 160 in the substrate 20 increases, more and more charge carriers 150 generated by increasingly longer-wave photons are conducted away via the space charge region 160, so that they do not reach the ammeter 110 via the first cathode 50.

Figure 3:
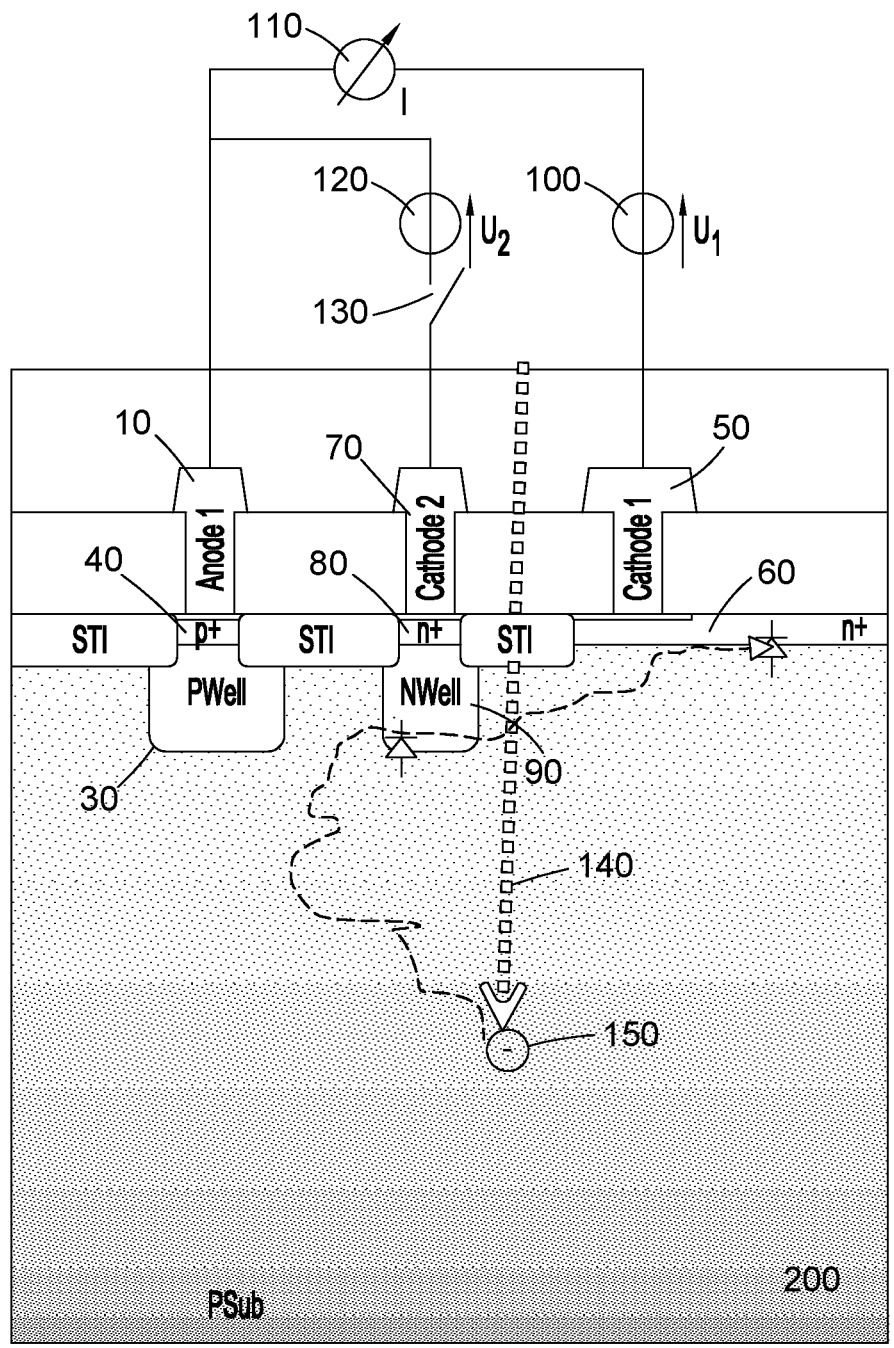
FIG. 3 shows a further embodiment of the invention, in which a steady-state electric field is generated in the substrate by a doping gradient.

FIG. 3 shows an arrangement which is geometrically similar to the arrangements shown in FIGS. 1 and 2. In contrast to the arrangements shown in FIGS. 1 and 2, in which the the substrate was positively doped homogeneously, the substrate 200 shown in FIG. 3 has a doping gradient, in which the positive doping concentration decreases as the distance from the surface of the substrate 200 increases, so that a steady-state electric field is generated by the doping concentration in the substrate 200. By virtue of this steady-state electric field, the charge carriers are moved in the direction of the surface of the substrate 200, so that the likelihood of the charge carrier reaching the first or second cathode is higher than is the case in FIGS. 1 and 2.

Figure 4:
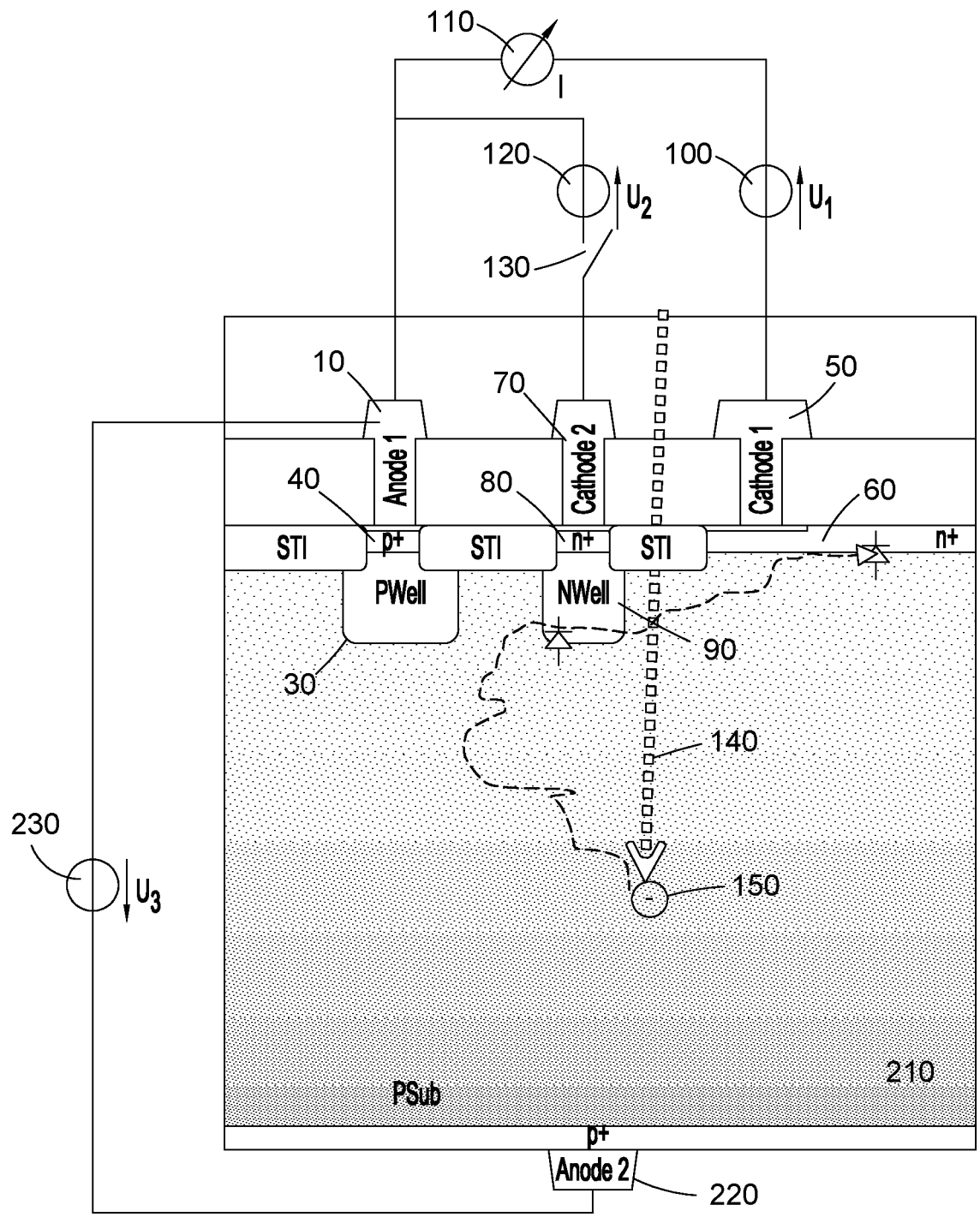
FIG. 4 shows a further embodiment of the invention, in which an electric field is impressed in the semiconductor by means of a second anode.

FIG. 4 shows an alternative arrangement, in which likewise a steady-state electric field is generated in the substrate 210. In contrast to FIG. 3, however, this steady-state electric field is generated not by gradients in the doping of the substrate but rather by a second anode 220 which is mounted below the substrate 210. A voltage $U_3$ between the second anode 220 and the surface of the substrate 210 containing the cathodes impresses a steady-state electric field which, as is also already the case in FIG. 3, moves negative charge carriers in the direction of the cathodes.

The two ways of generating a steady-state electric field, which are respectively described here in connection with FIGS. 3 and 4, can be used in combination with one another.

Figure 5:
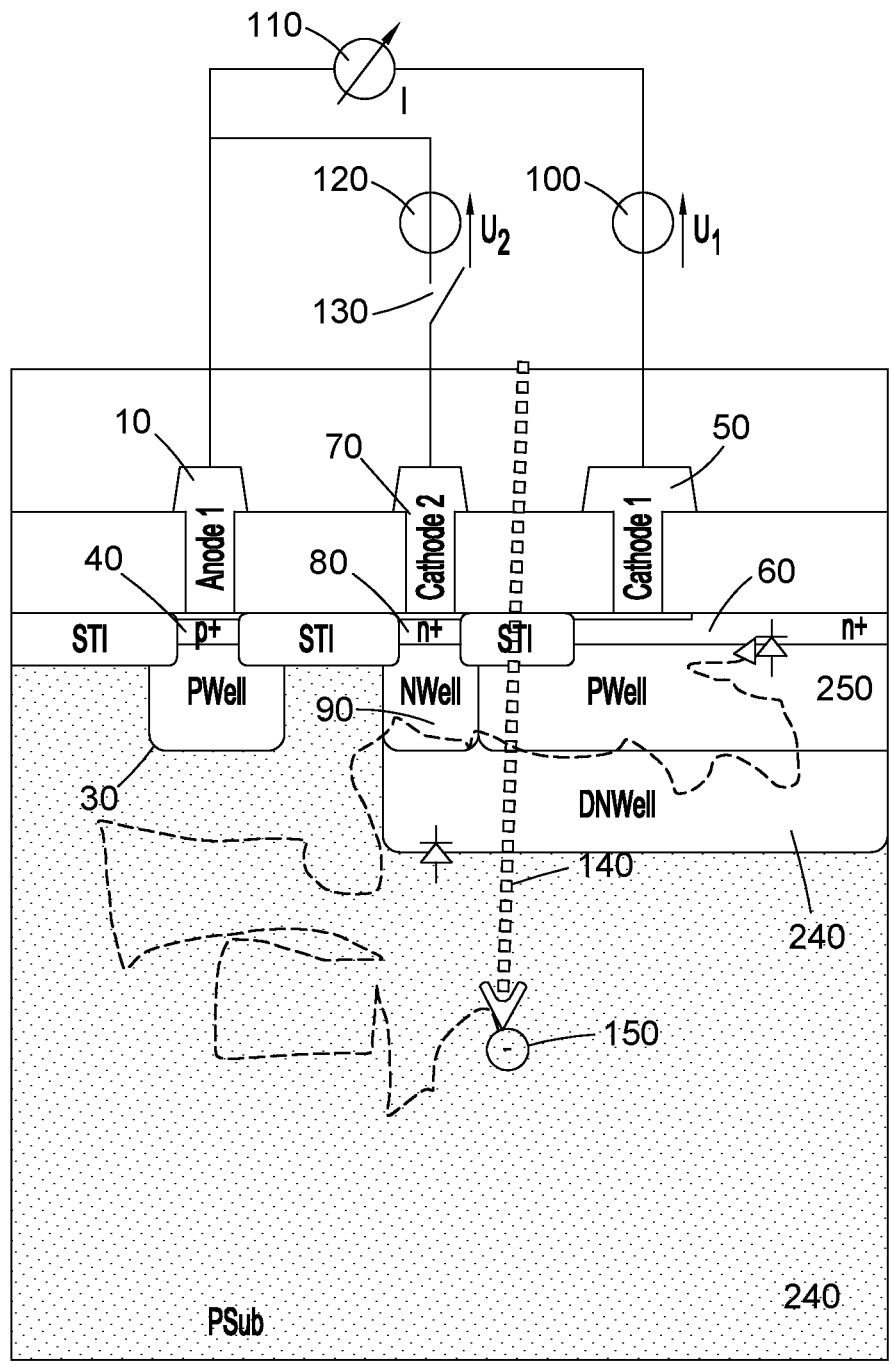
FIG. 5 shows a further embodiment of the invention.

FIG. 5 shows a further embodiment of the present invention. As can be seen in FIG. 5, a further, deeper-extending, negatively doped well 230 (DNWell) is bound to the negatively doped well 90 (NWell). Said further well not only extends in the direction perpendicular to the surface of the substrate 240 but completely envelops the positively doped well 250 below the first cathode 50. The positively doped well 250 generates an electric field which accelerates charge carriers in the well 250 towards the negatively doped region 60. This is also the case under the effect of the space charge region of the p-n junction associated with the second cathode. The positively doped well 250 additionally prevents any overlapping of the space charge regions of the two p-n junctions associated with the first and second cathodes, so that punch-through can be avoided. In one embodiment, the well 230 extends to the substrate surface along the entire circumference of the well 250. As can be seen from FIG. 5, charge carriers 150 which are not generated by the well associated with the first cathode can continue to diffuse towards the first cathode 50 as long as the second cathode 70 is switched to the floating state. However, if a voltage is applied to the second cathode 70, then charge carriers 150 which are generated either in the well 240 or in the semiconductor substrate 240 outside of the well are conveyed away via the second cathode 70, so that they can no longer be measured as a current flow via the first cathode 50 in the ammeter 110. In this embodiment, therefore, as soon as a voltage is applied to the second cathode 70, only charge carriers 150 which are generated within the well 250 associated with the first cathode 50 will be measured.

Figure 6:
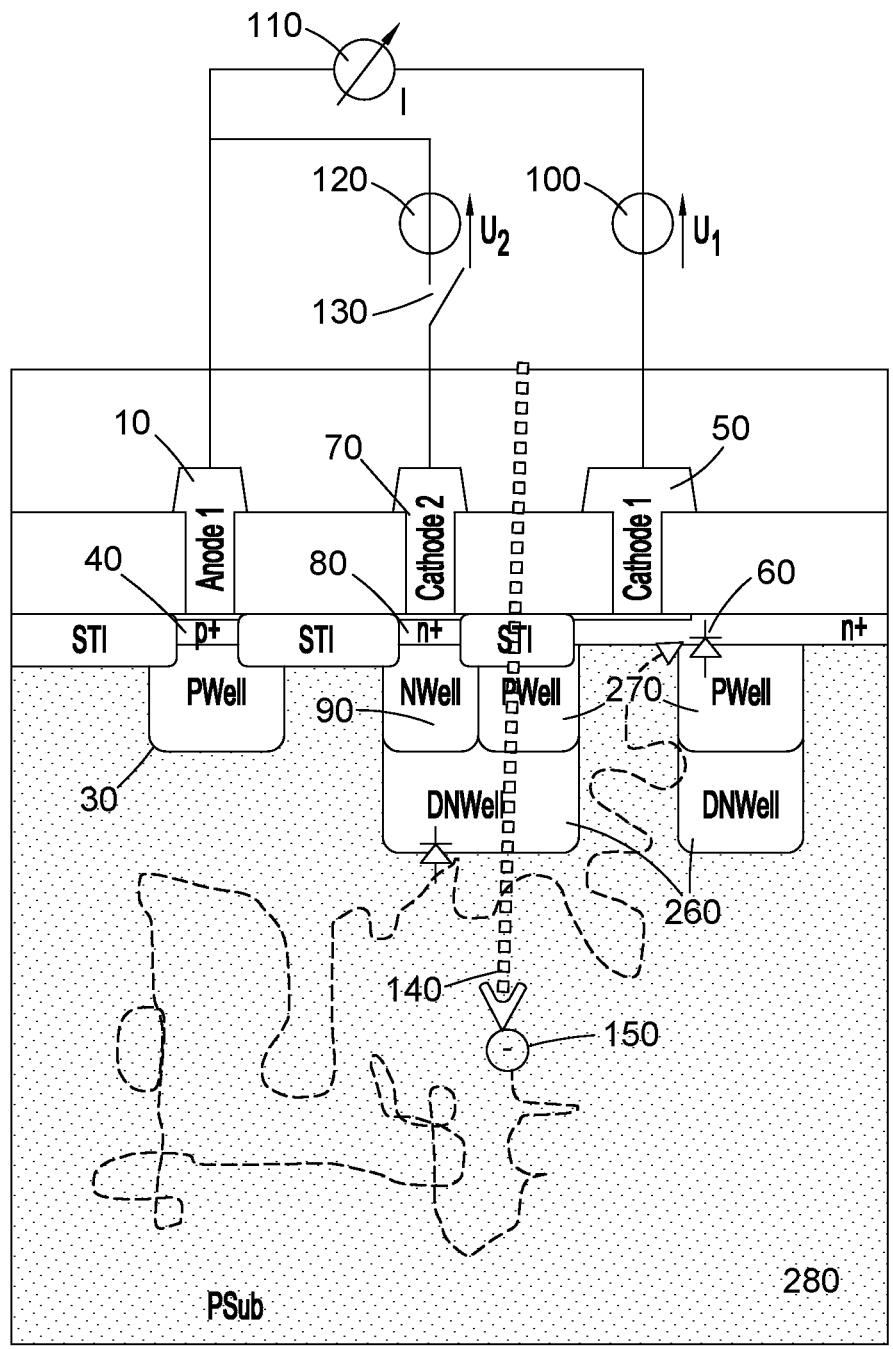
FIG. 6 shows a further embodiment of the invention, wherein the second cathode is switched to the floating state.
Figure 7:
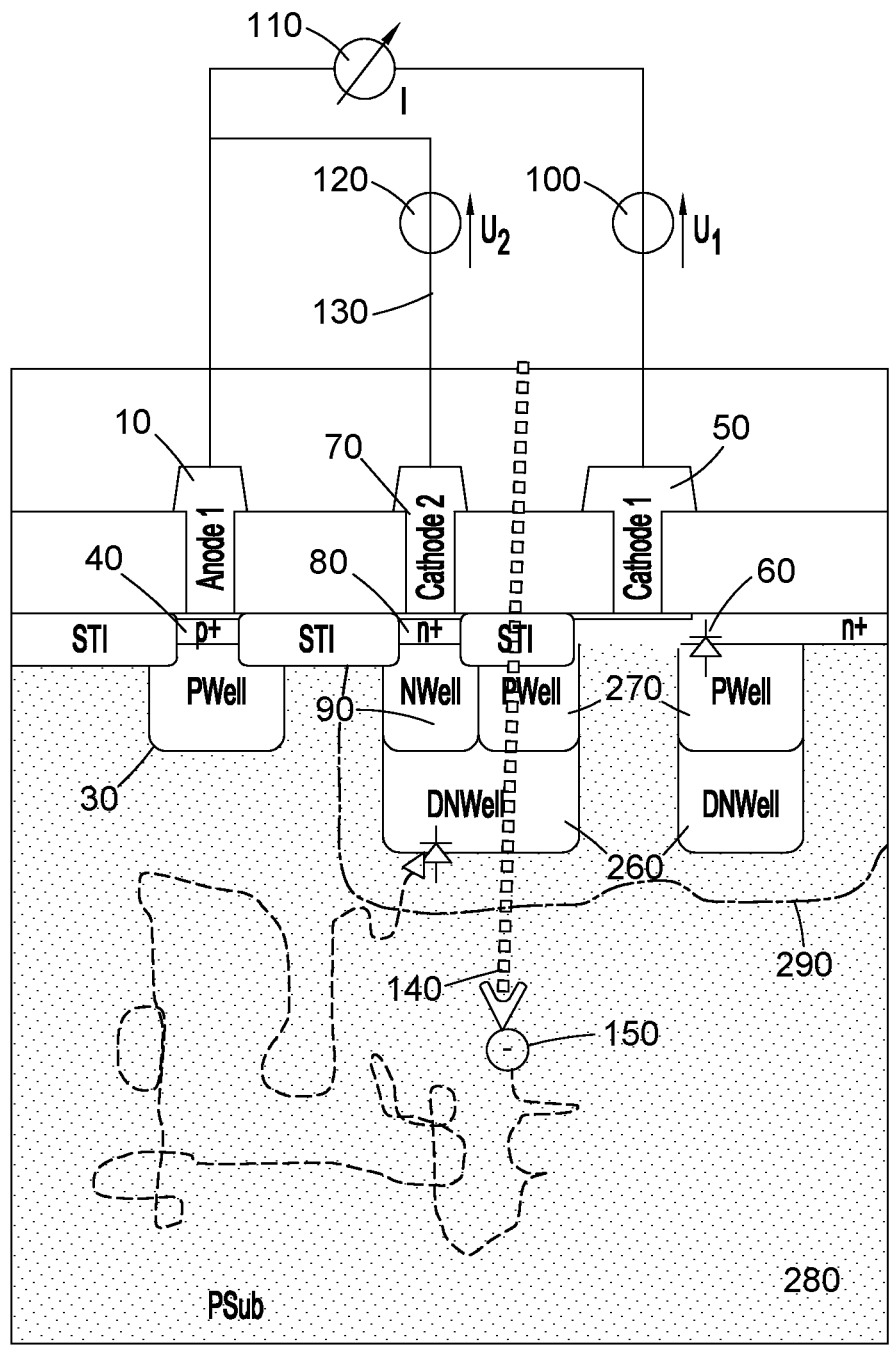
FIG. 7 shows the embodiment shown in FIG. 6, wherein a potential is applied to the second cathode.
Figure 8:
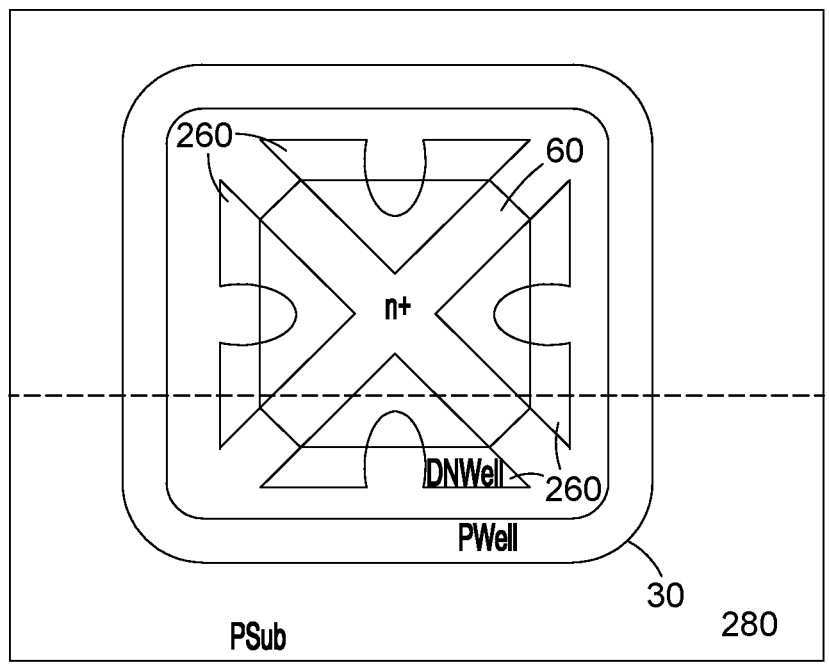
FIG. 8 shows a plan view of the embodiment shown in FIGS. 6 and 7.

FIG. 6 shows a further embodiment of the invention, wherein the second cathode is switched to the floating state. FIG. 7 shows the same embodiment, but in this figure a voltage is applied to the second cathode. In both of these figures, only one half of the substrate is shown in the lateral direction. The second half is, in this embodiment, mirror-symmetrical in relation to a vertical axis extending centrally through the right-hand combination of PWell and DNWell. A plan view of this embodiment, which comprises both halves of the substrate, can additionally be seen in FIG. 8. The dashed line shown in FIG. 8 represents the sectional plane shown in FIGS. 6 and 7. As already shown in FIG. 5, the well 260 encloses the well 270. In FIGS. 6-8, however, openings are left in the wells 260 and wells 270 so that the semiconductor substrate 280 is in direct contact with the first cathode 50. Both wells 260 and 270 are individually continuous structures, wherein the openings lie in the plane of the drawing and therefore give the appearance of a discontinuity. When the second cathode 70 is switched to the floating state, charge carriers 150 can pass both through the openings in the wells 260 and 270 and also through the wells 260 and 270 themselves to the first cathode 50, and from there can be measured as current flow by the ammeter 110. However, it is easier for the charge carriers to diffuse through the openings in the wells 260 and 270, so that the openings make it easier for the charge carriers to reach the first cathode 50. As soon as a voltage is applied to the second cathode 70, the space charge region 290 indicated by a dash-dotted line in FIG. 7 forms, which prevents charge carriers 150 formed outside of the well 270 from accessing the first cathode 50. In this embodiment, when a voltage is applied to the second cathode 70, the first cathode 50 can therefore detect only charge carriers which are formed between the well 260 and the substrate surface. Metal connections, which connect all the DNWell regions to one another, are not shown.

Figure 9:
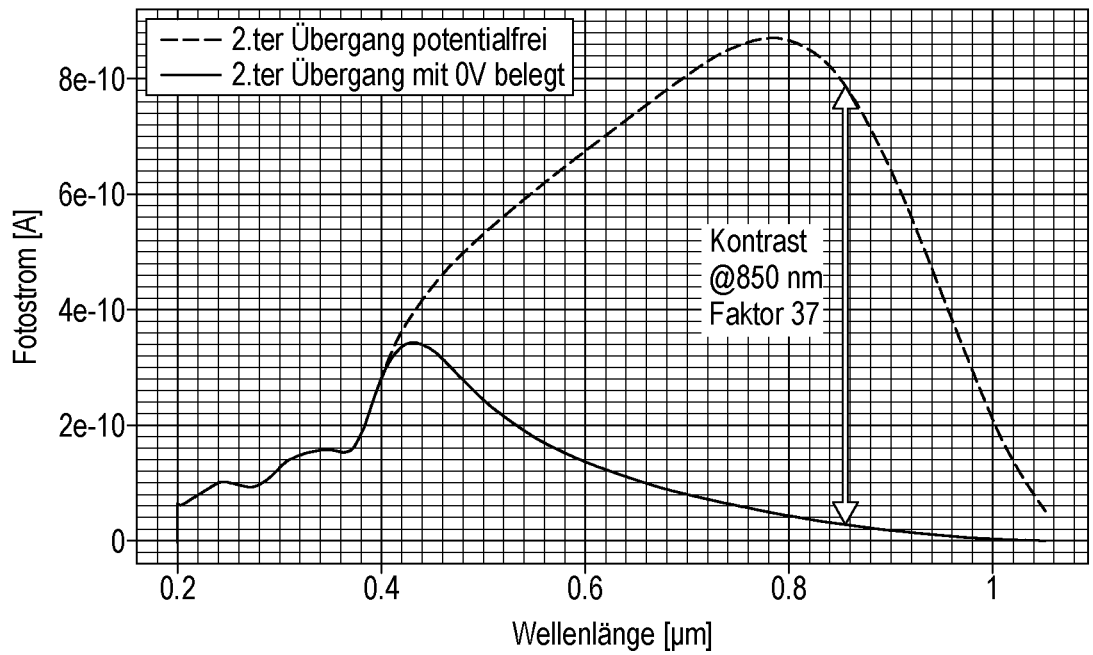
FIG. 9 shows the modulation contrast that can be achieved for the embodiment shown in FIGS. 6 and 7.

FIG. 9 shows a simulation of the difference in the wavelength dependence of the exemplary embodiment of the invention shown in FIGS. 6 to 8. The curve that runs higher shows the wavelength dependence of the photocurrent detected by the first cathode 50 when the second cathode 70 is floating. However, as soon as a voltage is applied to the second cathode 50, the current that can be measured by the first cathode 50 is drastically reduced as the wavelength increases, with a contrast factor of 37 for a wavelength of 850 nm being predicted by the simulation.

Hereinafter, a CMOS process which can be used to produce the exemplary embodiments described above will be described. The CMOS process begins with a substrate wafer which is either provided as a bulk wafer (homogeneous doping over the entire depth with approximately 10 Ohm/square) or as an epi wafer (epitaxially grown silicon layer of high purity, likewise approximately 10 Ohm/square or more), which has has been applied with a suitable epi thickness (for example 30 μm) to a highly doped substrate wafer (typically 10 mOhm/square).

As the process continues, two p-n junctions are formed, these being arranged close enough to one another in the lateral direction that they can be operated individually. However, the two p-n junctions are far enough apart that the two space charge regions do not engage in one another, so that undesired current flow (punch-through) is avoided. The required minimum spacing between the two p-n junctions depends on the dimensions of the respective spatial doping profiles. The latter in turn depend on the choice of doping concentration and on the choice of voltage to be applied to the second cathode. A person skilled in the art can readily determine the minimum spacing required under the selected conditions and can verify this by way of an isolation test between the p-n junctions. By applying a voltage to the second p-n junction, the spectral sensitivity of the first p-n junction can be reduced. Once the second p-n junction is switched back into the floating state, the first p-n junction regains its original spectral sensitivity.

Although the production method described above is a CMOS method, the substrate and the p-n junctions can also be produced by other known semiconductor production methods.

The ways of generating a steady-state electric field, described here respectively in FIG. 3 and FIG. 4, can be used in combination with one another and/or in combination with any other embodiment.

Although the invention has been described with reference to the above exemplary embodiments, it will be understood that these exemplary embodiments serve to illustrate the invention and that the claims are not limited to these exemplary embodiments. A person skilled in the art is capable of making modifications and alternatives which can be considered to fall within the scope of protection of the appended claims. Each of the features disclosed or shown in the present application can be incorporated in the invention, whether alone or in combination with another feature disclosed or shown in the application.

The invention claimed is:

1. An electrically modulatable photodiode, comprising:
   a substrate having a first and a second p-n junction, a common contact for jointly contacting one of the p-doped or n-doped regions of the two p-n junctions, and first and second further contacts for separately contacting the other of the p-doped and n-doped regions of the two p-n junctions; and
   a circuit which is configured:
      to switch the second further contact at different times to at least one first and one second switching state, wherein in the first switching state the second further contact is switched to a floating state and in the second switching state a potential is applied,
      wherein a constant reverse bias voltage is applied between the common contact and the first further contact while the second further contact is switched to the first switching state and while the second further contact is switched to the second switching state, and
      to measure a current flow caused by charge carriers which have been generated by impinging radiomagnetic waves in the substrate and which have reached the first further contact during each of the first and second switching states.

2. The electrically modulatable photodiode according to claim 1, wherein the second switching state comprises a plurality of additional switching states, wherein the circuit is further configured to apply a different potential to the second further contact in each of the plurality of additional switching states.

3. The electrically modulatable photodiode according to claim 1, wherein the p-n junction associated with the second further contact extends deeper into the substrate than the p-n junction associated with the first further contact.

4. The electrically modulatable photodiode according to claim 1, wherein the p-n junction associated with the second further contact contains a doped well, wherein the doped well partially encloses the p-doped or n-doped region contacted by the first further contact.

5. The electrically modulatable photodiode according to claim 4, wherein the circuit is further configured to apply in the second switching state a voltage which expands a spatial region of electrical influence associated with the second further contact so that portions of the substrate which are in direct contact with the p-doped or n-doped region contact by the first further contact are covered by the spatial region of electrical influence.

6. The electrically modulatable photodiode according to claim 1, wherein the electrically modulatable photodiode does not comprise more than one common contact for jointly contacting one of the p-doped or n-doped regions of the two p-n junctions.

7. The electrically modulatable photodiode according to claim 1, wherein the substrate has a doping gradient which runs perpendicular to the surface and which is structured to move charge carriers generated in the substrate towards the substrate surface.

8. The electrically modulatable photodiode according to claim 1, wherein the common contact is mounted on a first surface of the substrate, wherein a further common contact is mounted on a second surface of the substrate opposite the common contact, and wherein the circuit is further configured to apply to the further common contact with a voltage which moves charge carriers generated in the substrate in the direction of the first further contact.

9. The electrically modulatable photodiode according to claim 1, wherein the substrate and the doped regions associated with the two further contacts have been produced in a complementary metal oxide semiconductor (CMOS) process.

10. The electrically modulatable photodiode according to claim 1, wherein a doping concentration of the substrate in a region outside of the p-doped and n-doped regions of the first and second p-n junctions is between $1e12/cm^3$ and $1e16/cm^3$.

11. The electrically modulatable photodiode according to claim 1, wherein a doping concentration of a well associated with the second further contact is $1e16/cm^3$-$1e18/cm^3$.

12. The electrically modulatable photodiode according to claim 1, wherein a doping concentration of the substrate is such as to achieve a charge carrier diffusion length in a vertical direction which is at least equal to a lateral spacing between the two p-n junctions.

13. A substrate comprising a first and a second p-n junction, a common contact for jointly contacting one of the p-doped or n-doped regions of the two p-n junctions, and first and second further contacts for separately contacting the other of the p-doped and n-doped regions of the two p-n junctions, wherein an electrically modulatable photodiode comprising the substrate and a circuit is configured to:

switch the second further contact at different times to at least one first and one second switching state, wherein in the first switching state the second further contact is switched to a floating state and in the second switching state a potential is applied, and apply a constant reverse bias voltage between the common contact and the first further contact while the second further contact is switched to the first switching state and while the second further contact is switched to the second switching state, and to measure a current flow caused by charge carriers which have been generated by impinging radiomagnetic waves in the substrate and which have reached the first further contact during each of the first and second switching states.

14. A method for detecting a red light and/or infrared component of light impinging on the electrically modulatable photodiode according to claim 1, the method comprising:

measuring a current flowing in the first further contact, wherein the second further contact is switched to the floating state during the measurement; and measuring a current flowing in the first further contact, wherein a potential is applied to the second further contact during the measurement.

15. The method according to claim 14, further comprising determining a difference between the measurements.

16. A method for producing the electrically modulatable photodiode according to claim 1, the method comprising producing a doped substrate and producing the first and second p-n junctions so as to not engage in one another.

17. The method according to claim 16, wherein the method comprising a complementary metal oxide semiconductor (CMOS) method.

* * * * *